(12) United States Patent
Hung (10) Patent No.: US 9,887,011 B1
(45) Date of Patent: Feb. 6, 2018

(54) MEMORY WITH CONTROLLED BIT LINE CHARGING

(71) Applicant: MACRONIX INTERNATIONAL CO., LTD., Hsinchu (TW)

(72) Inventor: Ji-Yu Hung, Miaoli (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/425,363

(22) Filed: Feb. 6, 2017

(51) Int. Cl.
| G11C 11/34 | (2006.01) |
| G11C 16/04 | (2006.01) |
| G11C 16/24 | (2006.01) |
| G11C 16/08 | (2006.01) |
| G11C 11/56 | (2006.01) |

(52) U.S. Cl.
CPC ............ G11C 16/24 (2013.01); G11C 11/565 (2013.01); G11C 11/5628 (2013.01); G11C 11/5642 (2013.01); G11C 16/08 (2013.01)

(58) Field of Classification Search
CPC ..... G11C 16/24; G11C 16/08; G11C 11/5628; G11C 11/5642; G11C 11/565
See application file for complete search history.

(56) References Cited

U.S. PATENT DOCUMENTS

| 5,315,547 | A | 5/1994 | Shoji et al. |
| 5,835,414 | A | 11/1998 | Hung et al. |
| 6,885,250 | B1 | 4/2005 | Le et al. |
| 7,453,742 | B2 | 11/2008 | Maejima et al. |
| 7,755,945 | B2 | 7/2010 | Ho et al. |
| 8,305,815 | B2 | 11/2012 | La Rosa |
| 8,724,390 | B2 | 5/2014 | Hung et al. |
| 8,792,285 | B2 | 7/2014 | Hung |
| 8,897,058 | B2 | 11/2014 | Ahn |
| 8,995,211 | B2 | 3/2015 | Lee |
| 9,147,485 | B2 | 9/2015 | Hung et al. |
| 2009/0323432 | A1* | 12/2009 | Futatsuyama ...... G11C 16/3454 365/185.22 |
| 2014/0254260 | A1* | 9/2014 | Hung ..................... G11C 16/26 365/185.2 |
| 2015/0301885 | A1* | 10/2015 | Yuan ................... G06F 11/1004 714/807 |
| 2016/0071606 | A1* | 3/2016 | Kodama ................ G11C 16/26 365/185.21 |

(Continued)

OTHER PUBLICATIONS

Bedeschi et al., "Bit-Line Biasing Technique for Phase-Change Memories," ICSES'04, Sep. 13-15, 2004, 4 pages.

*Primary Examiner* — Toan Le
(74) *Attorney, Agent, or Firm* — Haynes Beffel & Wolfeld LLP (57) ABSTRACT

A memory device includes a memory array and bit lines coupled to the memory array. A voltage source is included for supplying a voltage used during a charging operation. Bit line clamp transistors, such as bit line clamp transistors, are coupled to the voltage source, and configured to regulate current on the corresponding bit lines in response to a bit line control signal. A control circuit generates the bit line control signal in response to a feedback signal. A feedback circuit is provided that is coupled to the voltage source and produces the feedback signal. The feedback circuit senses load of the bit lines being charged. The load of the bit lines being charged can be sensed by sensing the magnitude of the current from the voltage source during the charging operation.

20 Claims, 9 Drawing Sheets

(56) References Cited

U.S. PATENT DOCUMENTS

2016/0148692 A1    5/2016    Chen et al.
2016/0148694 A1    5/2016    Chang et al.
2016/0379699 A1*  12/2016  Takahashi ........... G11C 11/1673
                                                                 365/158

* cited by examiner

MEMORY WITH CONTROLLED BIT LINE CHARGING

BACKGROUND

Field of the Technology

The present disclosure relates to high density memory devices, in which bit line charging current used during operation of the devices is controlled.

Description of Related Art

NAND flash memory is widely adopted as a storage medium for mobile devices, solid-state disks in laptops and servers and for other data processing systems. As the data density on NAND flash memory chips has increased, page operations have become prevalent, in which large numbers of global bit lines are used in parallel for access to the memory cells of a page of data.

In memory operations that access a page of data, charging of the bit lines can be required. For example, in a page programming algorithm, the bit lines that are coupled to the memory cells to be programmed in the page may be left floating or discharged, while the global bit lines that are coupled to memory cells that are not to be programmed may be pre-charged before the programming pulses are applied to inhibit programming. In other algorithms and in other types of memory devices, the bit lines coupled to the memory cells to be programmed may be charged or pre-charged, while the bit lines unselected for programming may be left floating or discharged to inhibit programming.

The data pattern in a page programming algorithm can vary widely and, as a result, the number of the bit lines to be pre-charged varies as well. In addition, much of the load of bit lines arises from capacitive coupling due to differences in the voltages applied to adjacent bit lines. So, the total load that must be pre-charged for a given page program depends on the number and the pattern of the global bit lines involved for a given data pattern.

As the load varies, so does the amount of current needed to pre-charge the global bit lines within a specified time window for the operation. This variation in current and in load causes problems with peak current levels and with charging speeds.

It is desirable, therefore, to provide improved technology for providing current in bit line charging and pre-charging operations in high density memory.

SUMMARY

A technology is provided that can be used to control current during bit line charging or pre-charging operations for high density memory. A control circuit is used that limits peak currents and prevents large fluctuations in the current on the bit lines even as the loading varies, such as can be caused by variations in data patterns and the like during operation. Also, the level of the charging current, and the time required for charging, can be controlled in embodiments using feedback based on the load of the set of bit lines being charged.

In one aspect, a memory device is provided that comprises a memory array and a plurality of bit lines coupled to the memory array. A voltage source is included for supplying a voltage used during a charging operation. Bit line clamp transistors are coupled to the voltage source, and configured to regulate current on the corresponding bit lines in response to a bit line control signal. The bit line control signal is controlled according to a ramp function, having a controlled slope over at least portions of the charging interval, which allows the charging current to produce an increase in bit line voltage that remains consistent across all the bit lines being charged, and controls the magnitude of the current used during the charging operation. Active control of the bit line control signal voltage according to the ramp function can be implemented using a voltage ramp generator or an integrator circuit in various embodiments. The control circuit and ramp function can be used for active control of the bit line control signal voltage so that it increases with a rate of change that correlates with, or is actively responsive to, the rate of change of bit line voltages on the bit line being charged, so as to limit current flow to the bit lines such as by maintaining uniform and constant or near uniform and near constant gate to source voltages across the bit line clamp transistors, within reasonable tolerances to control current consumption as described herein.

For tighter control over the time intervals required for charging, a control circuit can be provided that generates the bit line control signal in response to a feedback signal. A feedback circuit is provided for this purpose that is coupled to the voltage source and produces the feedback signal. The feedback circuit senses load of the bit lines being charged. In embodiments described herein, the load of the bit lines being charged is sensed by sensing the magnitude of the current from the voltage source. Other techniques for sensing load may be used as well.

The control circuit can comprise a voltage generator which generates a voltage for the bit line clamp signal according to ramp function, including a linear ramp function configured to maintain a relatively constant current on the bit lines. The voltage of the bit line clamp signal can be controlled to increase linearly, or substantially so, according to a ramp function implemented by charging a capacitor with a constant current, with a rate that is slow enough to enable bit lines coupled bit line clamp transistors in a slow process corner having lower current capacity to charge at the same rate as bit lines coupled to bit line clamp transistors in a faster process corner having higher current capacity. In some embodiments, as mentioned above, the ramp function can have a controllable slope that is responsive to a feedback signal. In an embodiment described herein, the control circuit includes a current source and an adjustable capacitor connected to the current source, which produce a voltage ramp as a function of capacitance of the adjustable capacitor. The adjustable capacitor in some embodiments is responsive to the feedback signal to change the capacitance.

Also in embodiments described, the bit line control signal has a first ramp slope during a first interval of a charging cycle, or more generally a first rate of change across the first interval, and has a second ramp slope during a second interval of the charging cycle, or more generally a second rate of change across the second interval. In this embodiment, the second ramp slope is a function of the feedback signal. The feedback circuit can sense the magnitude of current output by the voltage source during the first interval as an indicator of the load of the bit lines being charged. The feedback signal is adjusted during the second interval in response to the magnitude sensed in the first interval in this example.

The technology described herein can be employed in a memory including a page buffer coupled to a plurality of bit lines of a memory array. The page buffer can comprise a plurality of bit line clamp transistors coupled to respective bit lines in the plurality of bit lines. A circuit in the page buffer is configured to connect a voltage source to the bit line clamp transistors coupled to the bit lines selected in response to a data pattern stored in the page buffer. A control circuit as described above is employed to generate the bit line control signal which is applied to the bit line clamp transistors.

In another aspect, the technology described herein comprises a method for operating a memory device having a page buffer and a plurality of bit lines coupled to the page buffer by bit line clamp transistors. The method comprises storing a data pattern in the page buffer, and applying a voltage from a voltage source to bit line clamp transistors of bit lines selected according to the data pattern. The method includes generating a bit line control signal for the bit line clamp transistors to regulate current flow to the bit lines in response to the voltage from the voltage source. Also, the method includes regulating the bit line control signal in response to a sensed load of the bit lines selected according to the data pattern. The bit line clamp transistors can comprise clamp transistors as discussed above. The current flow on the bit lines can be regulated based on the difference between voltage on the corresponding bit lines and voltage of the bit line control signal.

The bit line control signal can have a voltage generated according to a ramp function with an adjustable slope, where the adjustable slope is adjusted in response to a feedback signal based on the sensed load. In one example, the voltage of the bit line control signal is generated by producing a voltage ramp as a function of capacitance of an adjustable capacitor, and adjusting the adjustable capacitor in response to a feedback signal based on the sensed load. Other integrator circuits can be used as well, to actively control the voltage of the bit line control voltage.

The load can be sensed by sensing a magnitude of current supplied from the voltage source. The feedback circuit can sense the magnitude of the current during a first interval which indicates load of the set of bit lines being charged. The feedback circuit can adjust the slope of the voltage of the bit line control signal during a second interval response to the sensed current.

An "active" driver for the BLC voltage is described which limits fluctuations in current, and prevents the high peak current levels by increasing the BLC voltage at a rate of change that is slow enough that all of the bit lines selected can be charged up without exceeding a specified peak current level, and within the timing constraints of a program operation. This condition occurs when the gate to source voltage across the clamp transistor can be maintained constant or substantially constant as the bit line voltages increase under a wide range of conditions that are a function of such things like the differences between the BLC signal and the voltages on the bit lines being charged, process corners of the transistors and on the number of bit lines being charged.

Control of the gate to source voltage across the clamp transistor is accomplished according to a ramp function implemented using a linear voltage ramp generator that drives an op amp in illustrated embodiments. The op amp actively generates a BLC voltage (not passively) having a controlled slope according to the ramp function.

Other aspects and advantages of the present disclosure can be seen on review of the drawings, the detailed description and the claims, which follow.

DETAILED DESCRIPTION

A detailed description of embodiments is provided with reference to the FIGS. 1-10.

Figure 1:
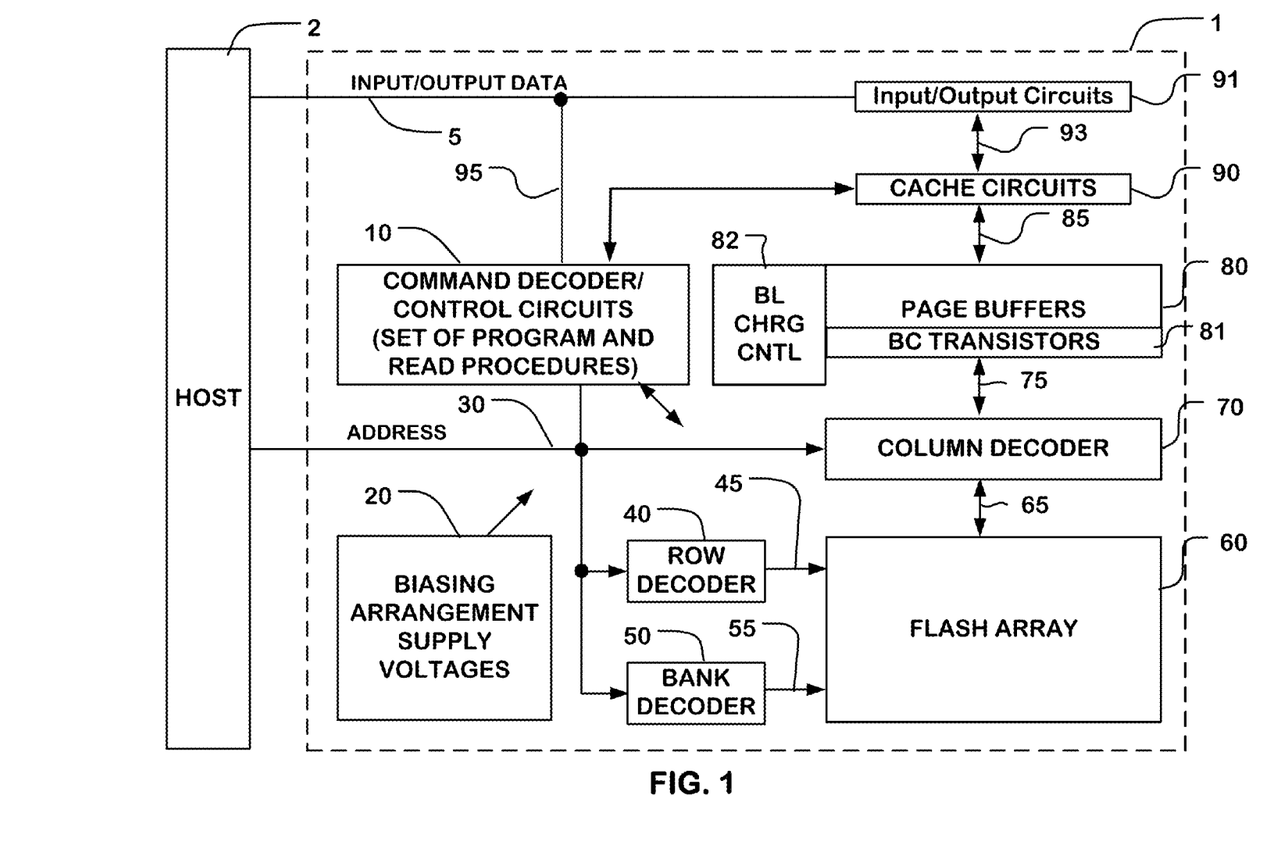
FIG. 1 is a block diagram of a memory system including a memory device having bit line current control technology as described herein.

FIG. 1 is a simplified diagram of a memory system including a flash memory device 1 implemented on an integrated circuit and a host 2 configured for page programming operations, including logic for page programming with bit line charge control circuits as described herein. In various embodiments, the memory device 1 may have single-level cells (SLC), or multiple level cells storing more than one bit per cell (e.g., MLC, TLC or XLC). The memory device can be implemented on a single integrated circuit chip, on a multichip module, or on a plurality of chips configured as suits a particular need.

The memory array 60 can be a NAND flash memory implemented using two-dimensional or three-dimensional array technology.

A row decoder 40 is coupled to a plurality of word lines 45, and arranged along rows in the memory array 60. A bank decoder 50 is coupled to a plurality of bank select lines 55 (such as SSL lines and GSL lines). A column decoder 70 is coupled to a plurality of bit lines 65 arranged along columns in the memory array 60 for reading data from and writing data to the memory array 60. A bus including address lines 30 and data lines 5 is illustrated in this example. Addresses are supplied on address lines 30 to circuits 10 implementing a command decoder and controller modules, to column decoder 70, to bank decoder 50 and to row decoder 40. In other examples, an input/output port may be used in which addresses and data may be provided on shared lines in an address/data bus. Also, serial interfaces may be deployed.

Page buffer circuits 80 are coupled to the column decoder 70, in this example via first data lines 75. The page buffer circuits 80 can store pages for multiple-level programming, for memory cells in a block of cells arranged for page programming. The page buffer circuits 80 include bit line clamp transistors 81 coupled in current flow communication with the bit lines in the array 60.

The page buffer circuits 80 can include circuits for selectively applying program and inhibit voltages to bit lines in the memory in response to the data pattern in the page buffer circuits 80 and control signals that set the program algorithm to be applied. As described herein, the bit line charging control circuit 82 can control the bit line clamp transistors 81 to regulate the current generated during bit line charging. The bit line charging control circuit 82 can regulate the current on the bit lines in response to load of the bit lines selected for charging according to the data pattern.

Bit lines for memory arrays can comprise global bit lines and local bit lines. Global bit lines generally comprise conductors in higher patterned layers that traverse a plurality of blocks of memory cells in an array, and connect to local bit lines in the blocks via block select transistors or bank select transistors. The local bit lines are connected to the memory cells for current flow to and from the global bit lines, which in turn are connected to the sensing circuits and page buffers.

In a read operation, sensed data from the page buffer circuits 80 are supplied via second data lines 85 to cache circuits 90, which are in turn coupled to input/output circuits 91 via data path lines 93. Also, input data is applied in this example to the cache circuits 90 on lines 93, and to the page buffer circuits 80 on lines 85, for use in support of multiple-level program operations as described herein.

Input/output circuits 91 provide communication paths for the data with destinations external to the memory device 1. Input/output data and control signals are moved via data lines 5 between the input/output circuits 91, the control circuits 10 and input/output ports on the memory device 1 or other data sources internal or external to the memory device 1, such as a general purpose processor or special purpose application circuitry, or a combination of modules providing system-on-a-chip functionality supported by the memory array 60.

In the example shown in FIG. 1, control circuits 10 include control modules implementing a bias arrangement state machine, or machines, which controls, or control, the application of supply voltages generated or provided through the voltage supply or supplies in block 20, such as read, erase, verify and program voltages including pre-charge voltages, for a set of selectable program and read operations.

The control circuits 10 are coupled to the cache circuits 90 and the memory array 60 and other elements of the integrated circuit as needed.

The circuits 10 can include modules implemented using special-purpose logic circuitry including state machines, as known in the art. In alternative embodiments, the circuits 10 can include modules implemented using a general-purpose processor, which can be implemented on the same integrated circuit, which execute a computer program to control the operations of the memory device 1. In yet other embodiments, a combination of special-purpose logic circuitry and a general-purpose processor can be utilized for implementation of modules in circuits 10.

The flash memory array 60 can comprise floating gate memory cells or dielectric charge trapping memory cells configured to store multiple bits per cell, by the establishment of multiple program levels that correspond to amounts of charge stored, which in turn establish memory cell threshold voltages VT. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 2 is coupled to the address lines 30 and data lines 5 on the memory device 1, as well as other control terminals not shown, such as chip select terminals and so on, and can provide commands or instructions to the memory device 1. In some examples, the host 2 can be coupled to the memory device using a serial bus technology, using shared address and data lines. The host 2 can comprise a general purpose processor, a special purpose processor, a processor configured as a memory controller, or other processor that uses the memory device 1. All or part of the host 2 can be implemented on the same integrated circuit as the memory.

The host 2 can include a file system or file systems that store, retrieve, and update data stored in the memory based on requests from an application program. In general, the host 2 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 2 can include application programs, file systems, flash translation layer programs and other components that can produce status information for data stored in the memory, including information marking data invalid as a result of such functions.

In high density memory, a page can comprise hundreds or thousands of bits, and a page buffer can be connected in parallel to the corresponding hundreds or thousands of bit lines. During program operations for example, one set of bit lines is selected to be biased for programming a particular data pattern, and a different set of bit lines is selected to be biased to inhibit programming according to the particular data pattern. For example, to inhibit programming in some program operations, the corresponding bit lines are pre-charged to a specified positive voltage. This pre-charge operation, and other bit line charging operations, can require significant current and consume a significant amount of time for the program operations. The amount of current and the amount of time required for the pre-charge operation depends on the load of the bit lines. As discussed above, the load depends both on the number of bit lines selected for the inhibit pre-charge, and on the pattern of bit lines selected for the inhibit pre-charge. Thus, this load can vary widely in systems having large page sizes. Technology described herein controls the current consumed during charging. Also technology described herein reduces the average length of the time interval required to complete the charging cycle.

In embodiments described herein, the bit line charge control circuit 82 can generate an increasing voltage, or otherwise increasing voltage (e.g. stepped) for the bit line clamp BLC signal that is applied to bit line clamp devices 81, according to a linear ramp function with a controlled slope. As a result of the BLC signal, the bit line voltage will also increase with the increasing BLC signal, with a difference in magnitude determined by a voltage drop between the BLC signal line and the bit line, which in embodiments described herein is equal to the gate to source voltage $V_{GS}$ of the bit line clamp transistors.

Also, in embodiments described herein, feedback control can be added. As described below, the current delivered to the bit lines can be further controlled using feedback that detects the bit line load, or such as by sensing a current magnitude in an initial stage, for a particular cycle which can vary with the number of bit lines and with a data pattern. The feedback can further manage peak current levels by controlling the shape, such as the rate of change, of the BLC signal, and enable optimizing the current levels for each charging cycle.

Figure 2:
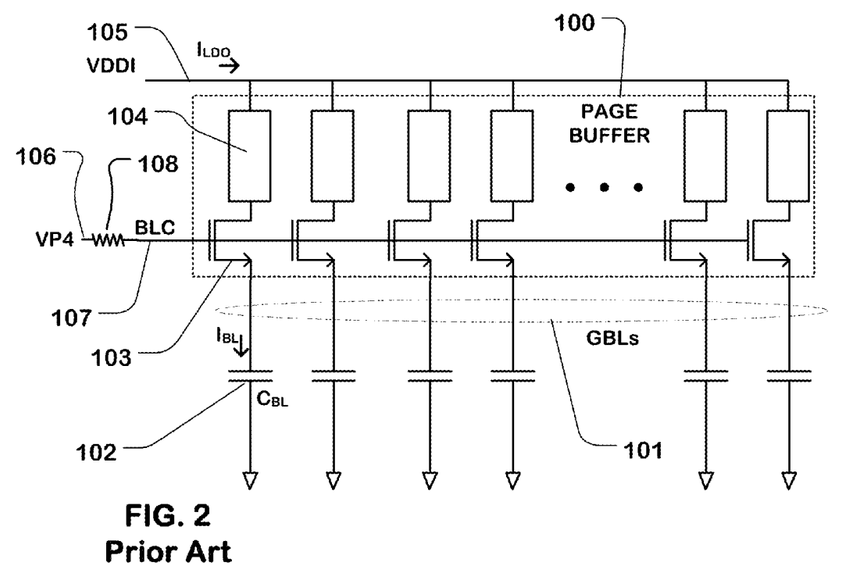
FIG. 2 is a simplified diagram of a memory with a page buffer and bit line clamp transistors as known in the prior art.

FIG. 2 is a simplified diagram of a prior art page buffer configuration, showing how peak current during a charging operation has been controlled. In the diagram, the page buffer 100 is coupled to a voltage source VDDI by a line 105. The page buffer 100 is also coupled to the global bit lines 101 of a memory array. The global bit lines are represented by corresponding capacitors 102 having a capacitance $C_{BL}$. As mentioned above, the load in a given charging event, which is a function of the capacitance $C_{BL}$, the number of bit lines being charged and other factors, can vary across the array and with different data patterns. The page buffer 100 includes a bit latch circuit 104 for each bit line in the plurality of global bit lines 101 coupled to the page buffer 100. An example of a bit latch circuit is described with reference to FIG. 3. The page buffer 100 also includes a bit line clamp transistor 103 coupled between the bit latch circuit 104 and the corresponding bit lines. The bit line clamp transistor 103 is typically a bit line clamp transistor having a first terminal in current flow communication with a voltage source selected by the bit latch circuit, a second terminal current flow communication with the bit line, and a gate coupled to a bit line control signal BLC on line 107. The bit line clamp transistor will pass current to the corresponding bit line as long at BLC is more than a threshold voltage greater than the voltage on the bit line being charged. As the voltage on the bit line approaches this level, the bit line clamp transistor reduces the current flow, and then cuts off. The current $I_{LDO}$ on the line 105 is the sum of the currents applied to the bit lines selected by the data pattern in the page buffer 100.

Peak current in the charging operation is limited in this prior art circuit by placing a resistor 108 between the bit line control signal VP4 on line 106, and the gates of the clamp transistors (e.g 103), which prevents rapid transition of the gate terminals on the gates. The voltage VP4 is set at a level that can fully pass the pre-charge voltage VDDI to the bit lines. However, this technology must be designed with margin to cover the load encountered in the worst possible data pattern, and must account for the process corner variations of the bit line clamp transistors and the resistor.

Figure 3:
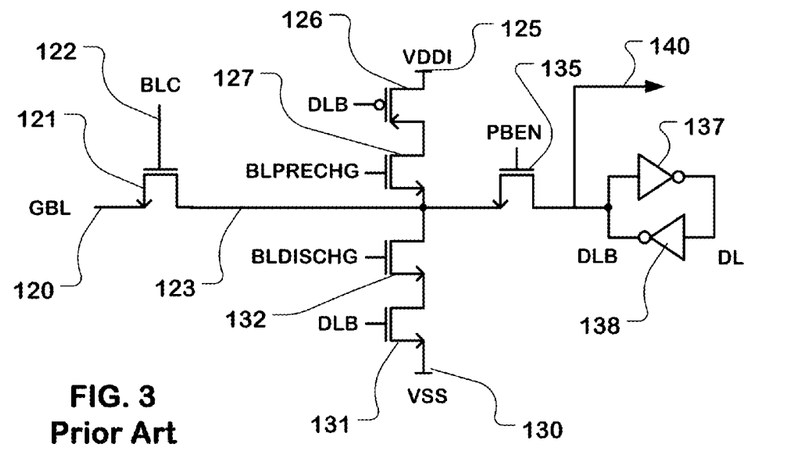
FIG. 3 is a schematic diagram representing a portion of a page buffer coupled to a global bit line, such as might be deployed in the prior art system of FIG. 3.

FIG. 3 illustrates the structure of a bit latch circuit which can be used for element 104 of FIG. 2, simplified to show elements that can be used for driving a bit line to a positive voltage or to ground in response to a data pattern. For the purposes of this description, the term "charging" refers to both driving the bit line to a higher voltage and driving the bit line to a lower voltage, including ground and negative voltages in some embodiments. Sometimes the function of driving the bit line to ground is referred to as discharging. Other elements (not shown) of the bit latch circuit can be considered schematically connected to line 140, and can include sensing circuits, timing circuits, and biasing circuits which are configured according to the particular memory technology utilized, and to support other types of reading and writing operations.

The bit latch circuit in the page buffer is connected to a global bit line 120. A bit line clamp transistor 121 has a first terminal connected to the global bit line 120 and a second terminal connected to node 123 in the bit latch circuit. The bit line clamp transistor 121 has its gate connected to the BLC line 122. A circuit including transistors 126 and 127 is provided for connecting node 123 to the voltage source 125 which applies, in this example, a reference voltage VDDI. A circuit including transistors 131 in 132 is provided for connecting node 123 to a voltage source 130 which applies, in this example, a reference voltage VSS. A pass transistor 135 is connected between node 123 and a latch which comprises inverter 137 and inverter 138 cross coupled to form a latch. The line 140 in this schematic is connected also to the node between the latch and the pass transistor 135.

The latch (inverters 137, 138) stores a bit of data DL and an inverse of the bit of data DLB. This data DL represents the data to be programmed to a memory cell on the global bit line 120. This data DL can be loaded into the latch (inverters 137, 138) from a cache or from another data source known in the memory technology. Thus, a data pattern to be programmed is represented by the contents of the latches in the bit latches in the page buffer 100.

The pass transistor 135 is controlled by a page buffer enable signal PBEN, which controls connection and disconnection of the node 123 to the line 140 and the latch (inverters 137, 138).

The transistor 126 is a p-channel transistor in this example, and has the inverse data bit DLB connected to its gate. The transistor 127 is placed between transistor 126 and node 123. Transistor 127 is a n-channel transistor having its gate connected to a bit line pre-charge signal BLPRECHG. The transistor 131 is a n-channel transistor in this example, and has the inverse data bit DLB connected to its gate. The transistor 132 is placed between transistor 131 and the node 123. Transistor 132 is a n-channel transistor having its gate connected to a bit line discharge signal BLDISCHG. The bit line pre-charge signal BLPRECHG and the bit line discharge signal BLDISCHG are logic timing signals used to determine the timing for pre-charging and discharging the bit line.

In operation, if the latch stores the value DL equal to zero, then the corresponding bit line is selected for programming. If the latch stores the value DL equal to 1, then the corresponding bit line is selected for inhibiting programming. During a pre-charge interval, for example, a program operation in which unselected bit lines are pre-charged to the level VDDI, the BLPRECHG signal is asserted. If the data bit DL in the latch (inverters 137, 138) is high (1), indicating that the bit line is selected for inhibit, then the inverse data bit DLB is low turning on the transistor 126 and connecting the voltage source 125 to node 123. At this time, the bit line control signal BLC is asserted to pass the voltage VDDI to the global bit line 120. Alternatively, during a discharge interval, selected bit lines are forced to VSS. In this case, the signal DL is low (zero) and the inverse DLB is high. DLB on the gate of transistor 131 connects node 123 to VSS when the timing signal BLDISCHG is asserted.

In page buffers designed for multilevel programming, there can be a plurality of bit latches, and a variety of timing and biasing circuits not shown, used in the sequence of operation applied for programming and inhibiting.

Figure 4:
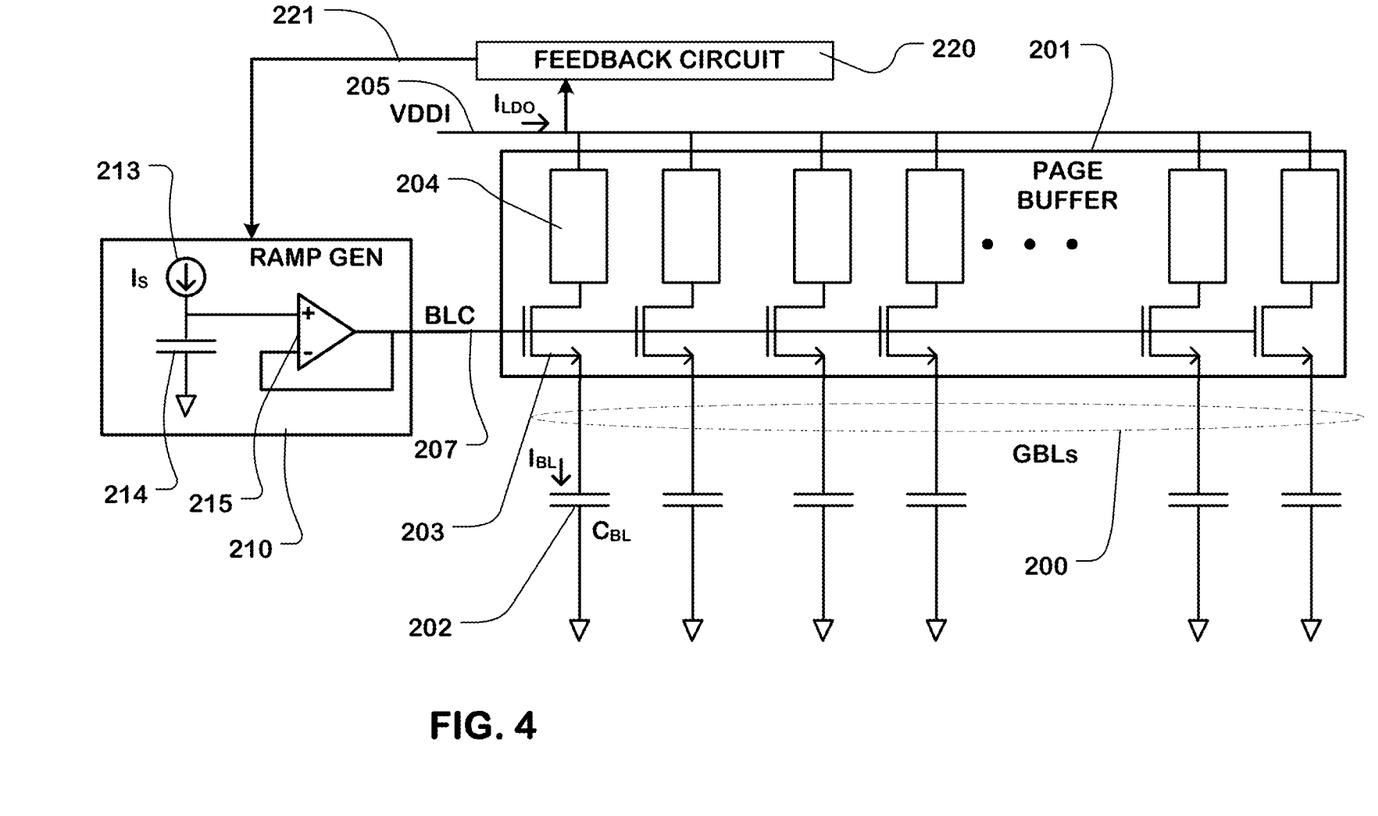
FIG. 4 is a simplified diagram of a memory with a page buffer and bit line clamp transistors including current control technology as described herein.

FIG. 4 is a schematic diagram of a memory array with a page buffer, having circuitry for controlling the charging current in response to the sensed load of the set of bit lines selected for charging. In FIG. 4, a plurality of global bit lines 200 is illustrated coupled to a page buffer 201, including a plurality of bit latch circuits (e.g. 204). As discussed above, each of the global bit lines has a capacitance $C_{BL}$ represented by a capacitor symbol (e.g. 202), and is coupled to a corresponding bit line clamp transistor 203 in the page buffer 201. The voltage source applies a reference voltage VDDI on line 205 to the bit latch circuits (e.g. 204) in the page buffer 201.

The bit line control signal BLC is produced by a control circuit 210 in combination in this embodiment with a feedback circuit 220. The feedback circuit 220 senses the load of the bit lines selected for charging, such as by sensing the magnitude of the current $I_{LDO}$, and generates a feedback signal on line 221 in response to the sensed load. The control circuit 210 comprises a voltage ramp generator. Schematically, the ramp generator comprises a current source 213 coupled to a capacitor 214. The current source can apply the constant current to the capacitor 214, so that the voltage on the capacitor integrates the current and generates a linearly increasing voltage with time. The capacitor is coupled to the input of an operational amplifier 215 configured for unity gain, in this example, the output of which is the BLC signal on line 207, which is connect to the gates of a plurality of bit line clamp transistors (e.g. transistor 203) in the page buffer 201. The feedback signal on line 221 from the feedback circuit 220 can be used to control the slope of the voltage ramp for example, in order to regulate the current flow between the voltage source on line 205 and the bit lines 200.

Figure 5A:
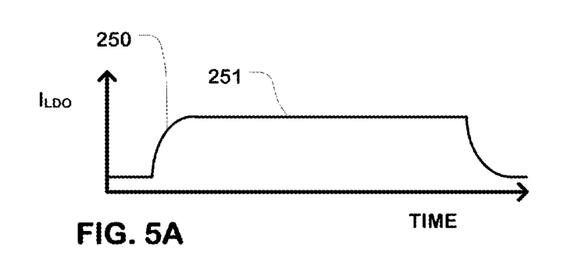
FIGS. 5A-5D are graphs referred to for the purposes of describing operation of current control technology described herein.
Figure 5B:
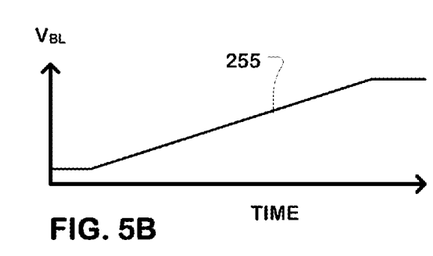
Figure 5C:
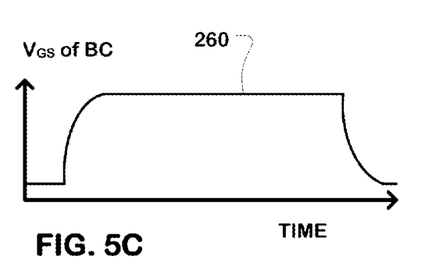
Figure 5D:
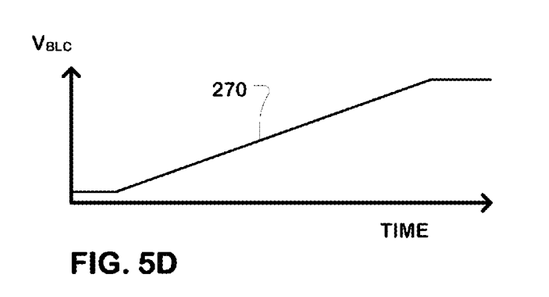

In preferred embodiments, the BLC signal is controlled so that the current $I_{LDO}$ from the voltage source to the bit lines is substantially constant during the charging interval, as illustrated by trace 251 in FIG. 5A, after the leading edge 250. As shown in FIG. 5B, the voltage on a bit line selected for charging by a constant current increases as illustrated by trace 255 with the relatively constant slope, that has a value which is a function of the capacitance of the bit line and the magnitude of the current. The current magnitude delivered to an individual bit line can be regulated however by the gate to source voltage $V_{GS}$ of the bit line clamp transistor ($V_{GS}$ of BC) coupled to the bit line. As illustrated in FIG. 5C, by maintaining $V_{GS}$ constant (trace 260) during the charging interval, the current flow through the bit line clamp transistor onto the bit line should also be substantially constant. The rate of change of the BLC signal can be controlled so that the current carrying capacity of the bit line clamp transistors is not exceeded, even for transistors in a slow process corner, and so the rate of change of the voltage on the bit lines is uniform, maintaining a constant $V_{GS}$ of about one threshold voltage margin. As a result of control of the BLC signal in this manner, the sum of currents applied to all of the bit lines selected for the charging operation remains substantially constant as well. As a result of this principle, the voltage of the BLC signal applied to maintain a constant charging current on the bit line selected for the charging operation can take the form of a voltage ramp 270 as shown in FIG. 5D. The BLC voltage can be actively controlled according to a ramp function so that the rate of increase of the BLC voltage correlates with the rate of increase of the BL voltages on the selected bit lines under the limitation of a specified peak current level. This prevents current spikes that could occur as result of rapid increase in the gate to source voltage on the bit line clamp transistors.

Figure 6A:
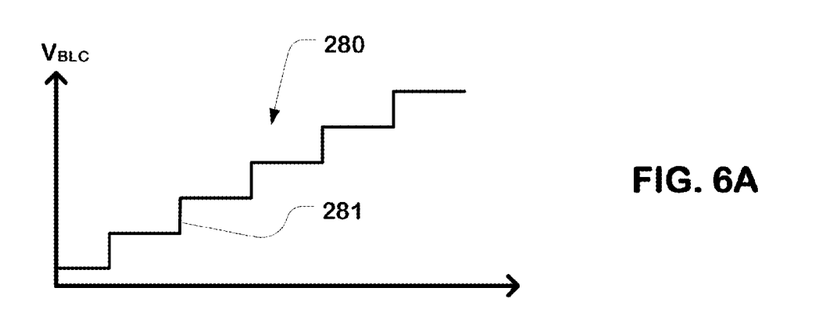
FIGS. 6A-6C are additional graphs referred to for the purposes of describing operation of current control technology as described herein.
Figure 6B:
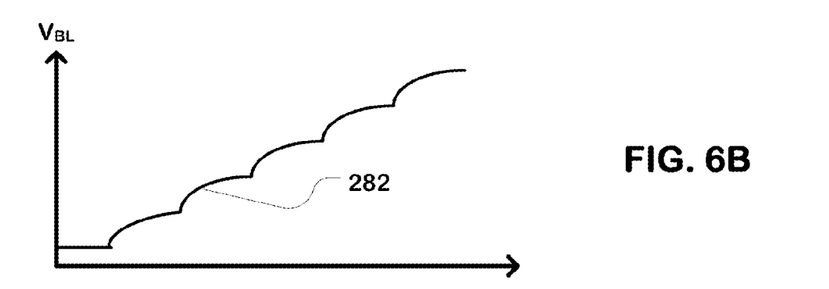
Figure 6C:
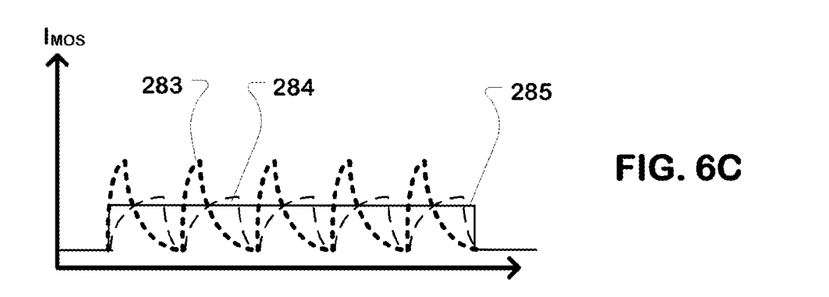

FIGS. 6A to 6C are diagrams demonstrating how the current on the bit lines can be independent of the manufacturing variations (i.e., process corners) that can impact current carrying capacity of the bit line clamp transistors. FIG. 6A shows a voltage ramp 280 for the voltage $V_{BLC}$ on the BLC signal which comprises a plurality of small steps (e.g. 281) which can be a function of a ramp function with a controlled slope. Considering the stepped voltage ramp 280 of FIG. 6A, FIG. 6B illustrates a trace 282 showing the manner in which the bit line voltage $V_{BL}$ would behave. That is, for each step (e.g. 281) in the BLC signal, the bit line voltage $V_{BL}$ will increase toward a level that is one threshold voltage below the magnitude of the step. FIG. 6C shows the current $I_{MOS}$ through an individual bit line clamp transistor under the scenario of FIG. 6A. The current $I_{MOS}$ for a given transistor depends on the manufacturing process corner and other variations in the transistors across the array. Thus, FIG. 6C shows a first trace 283 of a fast bit line clamp transistor and a second trace 284 of a slow bit line clamp transistor. In each step (e.g. 281) of the BLC signal, the fast transistors will rapidly rise to a peak current (first trace 283) to charge their corresponding bit lines, and fall to zero current as the bit line voltage approaches the level of the BLC signal. Also, in each step (e.g. 281) of the BLC signal, the slow transistors will more slowly rise to a peak current (second trace 284) which is lower than that of the fast transistors, and then fall to zero current as the bit line voltage approaches the level of the BLC signal. The slope of the ramp function for the voltage of the BLC signal can be set to ensure for each step, that the slow process corner devices are able to deliver enough charge to pull up the bit line voltage at the same slope, then the current on the bit lines can therefore be largely unaffected by the process variations in the MOS devices. This can result in a substantially constant current as represented by the trace 285. Thus, a technique as described herein can operate substantially independent of process variations in the manufacturing of the device. A smooth ramp in the BLC voltage can have the same result of substantially constant current over process corner variations.

Figure 7A:
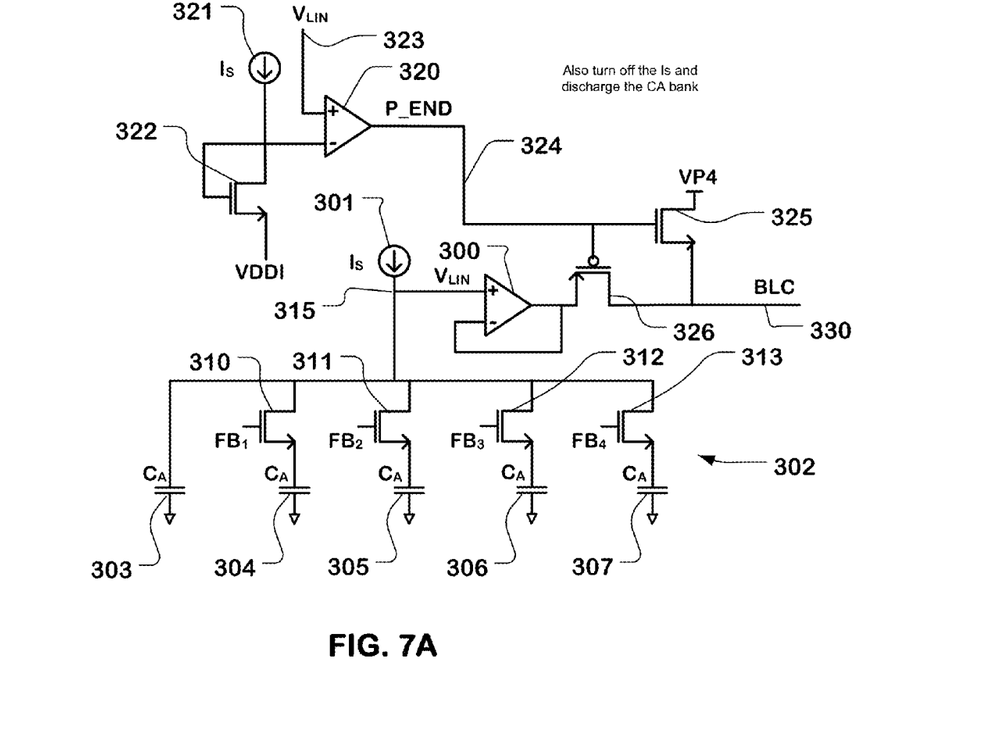
FIGS. 7A-7B together comprise a schematic diagram of a memory device including a more detailed example of current control technology.
Figure 7B:
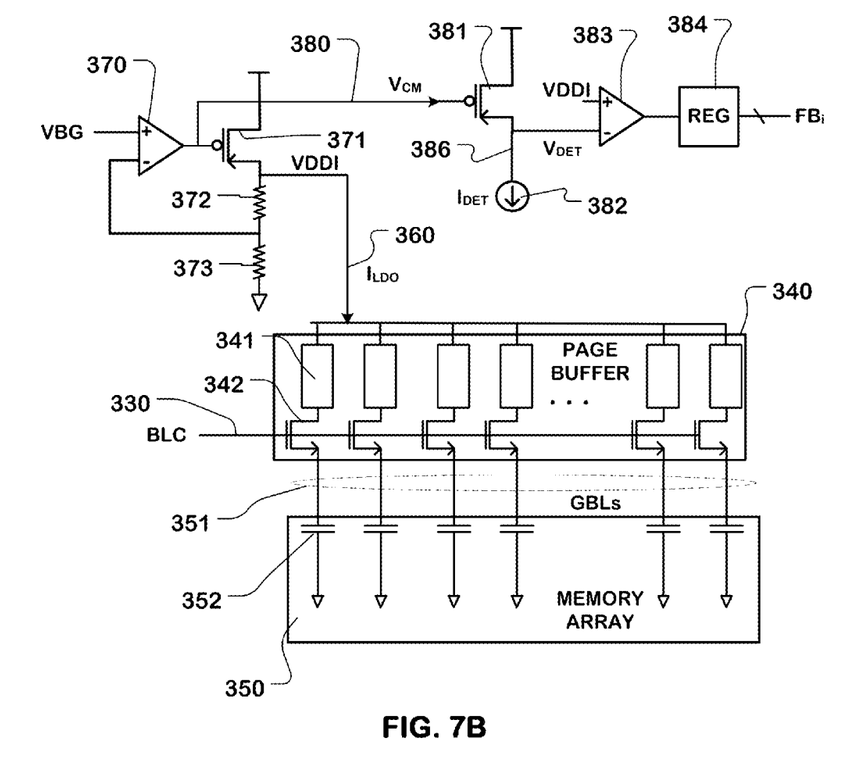

FIGS. 7A and 7B provide a more detailed schematic of circuitry that can adjust for the data pattern effect, and maintain substantially constant charging current. Furthermore, circuitry can be operated in a manner that offsets process variations in the implementation of circuitry.

FIG. 7A shows a control circuit used to generate the BLC signal on line 330 that can be controlled by feedback signals $FB_1$ to $FB_4$. The control circuit comprises an op amp 300 configured in a unity gain arrangement in this example, which actively controls the voltage of the BLC signal according to a ramp function defined by an integrator circuit. The integrator circuit includes a constant current source 301 delivering current to a node 315, and adjustable capacitor 302 connected between the node 315 and ground. The node 315 carries a voltage $V_{LIN}$ which increases linearly with time, having a slope which is a function of the current from the current source 301, and the capacitance of the adjustable capacitor 302. The adjustable capacitor 302 in this example comprises an array of capacitors 303-307. Each of the capacitors 303-307 has a capacitance CA in this example. In other examples, the capacitors can have varying capacitances as suits a particular technique for adjusting the capacitance value of the adjustable capacitor. In the array of capacitors, capacitor 303 is connected between ground and the node 315, and provides a minimum capacitance. The capacitors 304-307 are connected to the node 315 through respective select transistors 310-313. The gates of the transistors 310-313 are connected to the feedback signal, which in this example comprises a four bit signal $FB_1$, $FB_2$, $FB_3$, and $FB_4$. In operation, the slope of the voltage ramp voltage $V_{LIN}$ is determined by the magnitude of the current $I_S$ from the current source 301, and the sum of the capacitance is selected by feedback signal $FB_1$, $FB_2$, $FB_3$, and $FB_4$. The adjustable capacitor 302 in this example is thus digitally controlled by a digital feedback signal. In alternative embodiments, an analog adjustable capacitor, such as a varactor can be used. Also, other types of voltage ramp circuits or other types of control circuits can be used to generate the BLC signal in response to feedback about the load of the selected bit lines, in a manner that controls the current used in charging bit lines.

FIG. 7A also shows a circuit to generate a program end control signal P_END, when the voltage $V_{LIN}$ reaches a level that is about one threshold voltage above VDDI. The circuit includes a comparator 320, having a positive input coupled to node 315 to receive voltage $V_{LIN}$ by line 323, and a second input coupled to the drain of transistor 322. The current source 321 is coupled to the drain of transistor 322. Also, the source of transistor 322 is coupled to the reference voltage VDDI. The comparator 320 asserts a logical 1 P_END on line 324 when voltage $V_{LIN}$ reaches the level of the voltage on the drain of transistor 322. This signals the end of the BLC voltage ramp. Signal P_END can be used in some embodiments to disable the ramp generator circuit and control discharge of the array of capacitors to reset the voltage ramp generator. Schematically, FIG. 7A shows a p-channel pass gate 326 between the output of the op amp 300 and the line 330. Also, FIG. 7A shows a n-channel transistor 325, coupled between line 330 and a supply voltage VP4, which has a level above VDDI, by at least one threshold that is sufficient to ensure that the full voltage VDDI can be maintained on the bit lines through the bit line clamp transistors. Thus, when the P_END signal is asserted in this example, the output of the voltage ramp generator is disconnected from line 330, and the voltage VP4 is connected to the line 330.

FIG. 7B illustrates a memory array 350 with a page buffer 340 having a voltage source and feedback circuit used to generate the feedback signals $FB_i$ which are returned to the adjustable capacitor 302 of FIG. 7A. The memory array includes a plurality of global bit lines 351, each having a capacitance (e.g. 352). The page buffer includes bit line clamp transistors 342, and a bit latch 341 for each of the global bit lines. The DLC signal is applied on line 330 from the circuitry in FIG. 7A.

The voltage source is shown which generates the reference voltage VDDI. In this example, the voltage source comprises an op amp 370, having a bandgap voltage VBG applied to one input. The output of the op amp is applied to p-channel transistor 371, which has a source terminal coupled to a supply potential, the drain coupled to a resistor divider comprising resistors 372 and 373 connected in series to ground. The node between the resistors 372 and 373 is coupled to the second input of the op amp 370. The voltage at the drain of transistor 371 is maintained at a constant level VDDI in this arrangement, and applied on line 360 to the page buffers 340.

The magnitude of the load of the global bit lines selected for the charging operation according to the data pattern is sensed using a current sensor. The current sensor includes a current mirror transistor 381 having a gate connected by line 380 to the gate of the complement of the current mirror transistor 371 in the voltage source. The voltage $V_{CM}$ causes the magnitude of the current through the transistor 381 to track magnitude of the current through transistor 371 according to the ratio of the sizes of the transistors. In one embodiment, the transistor 381 has a size which is 1/1000 that of the transistor 371, and thus conducts about 1/1000 of the current $I_{LDO}$. For example, if the current $I_{LDO}$ is 50 mA, then the current in transistor 381 can be about 50 μA.

The current mirror transistor 381 supplies current to a node 386, which is also coupled to an adjustable current source 382 that produces a current $I_{DET}$. The voltage $V_{DET}$ on the node 386 has a level that is a function of the difference between the current output by the current mirror transistor 381, and the current of the adjustable current source 382. The voltage $V_{DET}$ is applied to a first input of comparator 383. The reference voltage VDDI in this example is applied to the second input of the comparator 383. The output of the comparator is applied to register 384 in which digital feedback signal $FB_i$ is stored. In operation, the adjustable current source 382 can be scanned in steps in the results of the comparison in comparator 383 latched in each step in the register 384. Thus, the four-bit feedback signal in this example can have a value 0000 at the beginning of a charging cycle. The adjustable current source 382 can be set to a first value, and the output of comparator sensed and stored in the first bit position $FB_i$. This can be repeated three additional times, for the three other bit positions $FB_2$, $FB_3$, $FB_4$. Depending on the magnitude of the current $I_{LDO}$, the four-bit feedback signal can have the values 0000, 0001, 0011, 0111 and 1111. These scanning of the adjustable current source 382 is explained with reference to FIG. 8 with the changes in timing signals deti(i), represented as hexadecimal Numbers 0, 1, 3, 7 and F, in the timing diagram of FIG. 9.

As the voltage level VDDI is maintained constant, the current $I_{LDO}$ will vary as a function of the load. As described above, the load is determined by the data pattern stored in the page buffer, and the capacitance of the individual bit lines selected for the charging operation.

Figure 8:
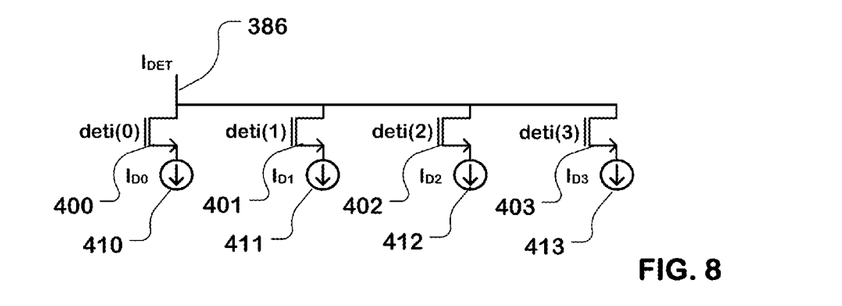
FIG. 8 is a simplified schematic diagram of a circuit which can be used to generate the current $I_{DET}$ of FIG. 7B.

FIG. 8 illustrates an example of an adjustable current source 382 which can be used with the circuit of FIG. 7B. In this example, an array of current sources 410-413 is provided, each of which provides a constant current $ID_0$, $ID_1$, $ID_2$, $ID_3$. The array of current sources 410-413 is coupled through corresponding select transistors 400-403 to the node 386 which carries the $I_{DET}$ current. Timing signals deti(0), deti(1), deti(2) and deti(3) are applied to the gates of the respective select transistors 400-403, and a sequence is used to control the magnitude of the $I_{DET}$ current. Of course, other controllable current source technologies can be applied in other implementations of the circuit.

Figure 9:
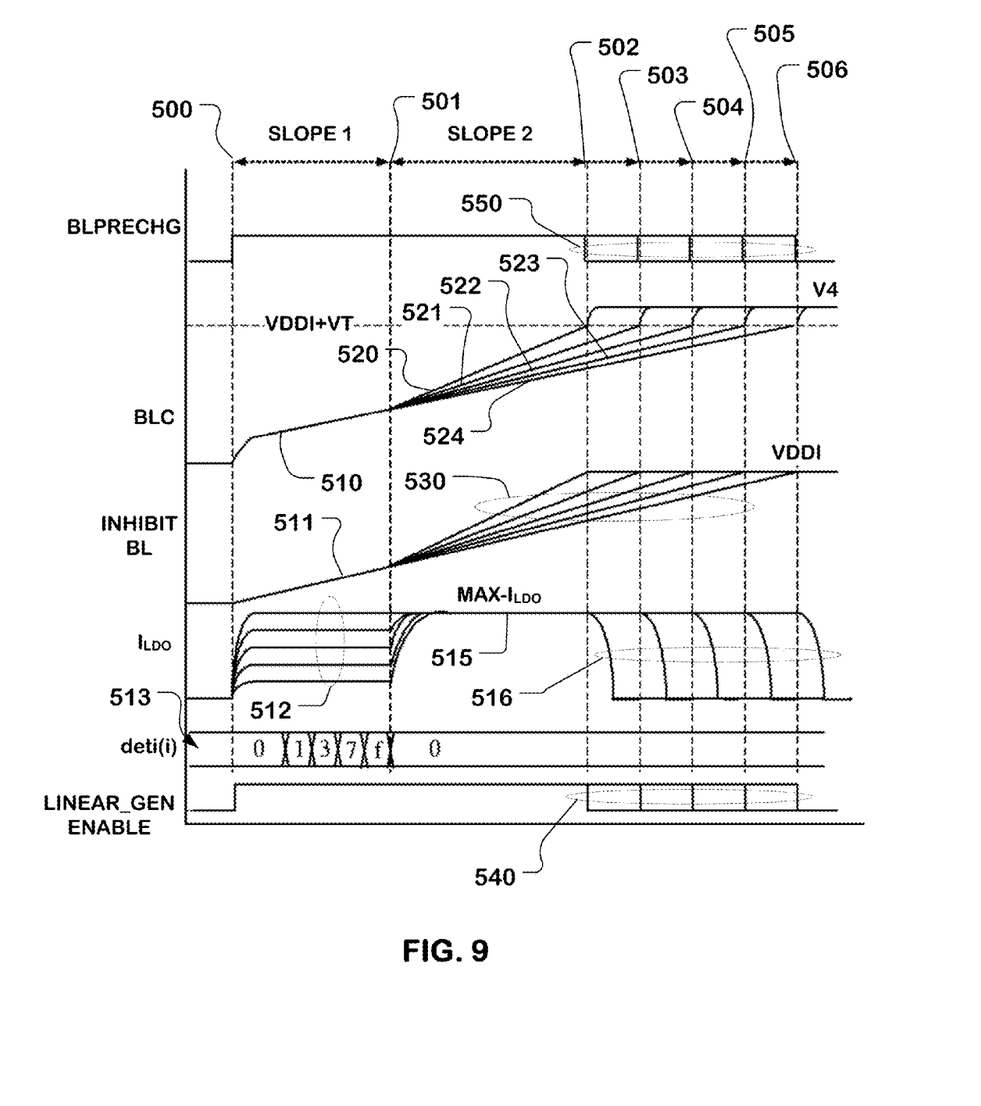
FIG. 9 is a timing diagram referred to for the purposes of describing operation of the circuit of FIGS. 7A-7B.

FIG. 9 is a timing diagram showing various signals which occur during a charging cycle for a bit line charging operation using the circuit such as shown in FIGS. 7A, 7B and 8. The timing diagram shows a sequence of points in time 500, 501, 502, 503, 504, 505, 506 in a charging cycle. The BLPRECHG signal, corresponds to the signal of the same name in the bit latch schematic shown in FIG. 3. It controls the timing of the connection of the voltage source to the bit line clamp transistors. The BLC signal is the control signal applied to the gates of the bit line clamp transistors as discussed above. The "inhibit" BL is the voltage of the bit line being charged. The $I_{LDO}$ shows a variety of current levels which can be encountered during operation of the current control circuitry described herein. The deti[3:0] signals are used to control the adjustable current source as shown in the example of FIG. 8. The LINEAR_GEN enable signal turns on the voltage ramp generator. The signal can be terminated by the P_END signal described in FIG. 7A.

A first interval of the charging cycle occurs between time 500 and time 501. At time 500, LINEAR_GEN enable signal is asserted turning on the BLC voltage ramp generator. Also at time 500, the BLCPRECHG signal is asserted, connecting the voltage source VDDI to the BLC line at the gates of the bit line clamp transistors. The adjustable capacitor 302 in the BLC voltage ramp generator is set to the largest value including all five of the capacitors 303-307, causing the slowest ramp (smallest slope). This smallest slope 510 is designed so that the current $I_{LDO}$ reaches a maximum level (MAX-$I_{LDO}$) specified for the implementation when the maximum load occurs in the selected set of bit lines. As a result, the BLC level increases with slope 510, after a leading-edge boost caused by turning on the control signals. As the BLC level increases with a slope 510, the voltage on the bit lines being charged increases with a slope 511. The difference between the BLC signal and the voltage on the bit lines is maintained relatively constant during this first interval, so that the current $I_{LDO}$ reaches a constant value during the interval 512. The level reached during the interval 512 of the current $I_{LDO}$ is a function of the load of the bit lines selected for the charging cycle, according to the data pattern stored in the page buffer. During this interval, the deti[3:0] signals are asserted in the sequence 0000, 0001, 0011, 0111 and 1111 represented in the timing diagram as hexadecimal 0, 1, 3, 7 and F. As result, $I_{DET}$ has a stepped wave form, such that 20% of the maximum $I_{LDO}/n$, where "n" is the current division factor of the current mirror (such as 1000 in some examples), is applied in a first phase, 40% is applied in a second phase, 60% is applied in a third phase, and 80% is applied in a fourth phase. When the voltage $V_{DET}$ is equal to VDDI, then the current through the current mirror transistor 381 is equal to a maximum current Max-$I_{LDO}/n$. When the voltage $V_{DET}$ is less than VDDI, then the current through the current mirror transistor 381 is tending toward a greater current than the maximum MAX-$I_{LDO}/n$. Also, when the voltage $V_{DET}$ is greater than VDDI, then the current through the current mirror transistor 381 is tending toward a lesser current than the maximum Max-$I_{LDO}/n$.

During each of the four steps 1, 3, 7 and F, the output of the comparator in the current sensing circuit is latched in the register 384 of FIG. 7B, to form the signal $FB_i$ as discussed above, at the end of the first interval at time 501. Thus, in each detection phase, $V_{DET}$ is compared with VDDI, and the phase in which $V_{DET}$ is smaller than VDDI is recorded. The value can be used as feedback. In this example, there are five possible feedback values indicated by the following conditions:

(1) in phase 1, if $V_{DET}$ is smaller than VDDI, meaning that $I_{LDO}$ is less than 20% of MAX-$I_{LDO}$, and the feedback signal $FB_i$ is set to 0000, turning off all four of the selectable capacitors so that the slope is increased by a factor of five.

(2) in phase 2, if $V_{DET}$ is smaller than VDDI, meaning that $I_{LDO}$ is between 20% and 40% of MAX-$I_{LDO}$, and the feedback signal $FB_i$ is set to 0001, turning off three of the selectable capacitors so that the slope is increased by a factor of 2.5.

(3) in phase 3, if $V_{DET}$ is smaller than VDDI, meaning that $I_{LDO}$ is between 40% and 60% of MAX-$I_{LDO}$, and the feedback signal $FB_i$ is set to 0011, turning off two of the selectable capacitors so that the slope is increased by a factor of 1.66.

(4) in phase 4, if $V_{DET}$ is smaller than VDDI, meaning that $I_{LDO}$ is between 60% and 80% of MAX-$I_{LDO}$, and the feedback signal $FB_i$ is set to 0111, turning off one of the selectable capacitors so that the slope is increased by a factor of 1.25.

(5) in phase 5, if $V_{DET}$ is always larger than VDDI, meaning that $I_{LDO}$ is between 80% and 100% of MAX-$I_{LDO}$, and the feedback signal $FB_i$ is set to 1111, turning on all of the selectable capacitors so that the slope is maintained at the same level as that of the first interval.

Of course, other sensing patterns using more steps, fewer steps, analog ramps, and other approaches can be implemented as suits a particular design.

A second interval of the charging cycle occurs between time 501 and a time 506. At time 501, the adjustable capacitor in the voltage ramp generator is set using a feedback signal $FB_i$.

As a result, the BLC signal increases in the second interval with a slope that depends on the level of the signal $FB_i$. The BLC signal will have a fast slope 520, if the feedback signal is 0000 and indicates a low load. The BLC signal will have an intermediate slope 521, if the feedback signal is 0001, and indicates a first intermediate load. The BLC signal will have a second intermediate slope 522, if the feedback signal is 0011, and indicates a second intermediate load. The BLC signal will have a third intermediate slope 523, if the feedback signal is 0111, and indicates a third intermediate load. The BLC signal will have a fourth slow slope 524, if the feedback signal is 1111, and indicates a large load.

The BLC signal reaches VDDI+VT at different times depending on the rate of charging of the bit lines. In this example, the BLC signal reaches this level at the times 502, 503, 504, 505, or 506 for the corresponding slope examples 520-524. At this stage, according to the circuit of FIG. 7A, the BLC signal will be pulled to the level VP4. At the same time, the voltage on the bit lines being charged increases at rates (530) determined by the BLC signals, and reaches the level VDDI at the corresponding times 502-506.

The current $I_{LDO}$ reaches a constant level 515 during the second interval of the charging cycle and maintains that level until the bit lines being charged reach the voltage level VDDI, in which time the current level falls off in the interval 516.

Also when the BLC signal reaches the level VDDI+VT, the PGM_E signal is asserted, causing the LINEAR_GEN enable signal to turn off (transitions 540), and disable the voltage ramp generator for this charging cycle. Also at this time, the BLPRECHG signal can be switched low, decoupling the bit line from the voltage source (transitions 550). Then, the next stage in a program operation can begin. Because the low load data patterns can pre-charge more quickly, the average time required for a program operation can be reduced for high density memory. Also, this improvement is achieved while maintaining control over the peak current consumed for the pre-charging operation.

As illustrated in FIG. 9, the current magnitude of the bit line charging current $I_{LDO}$ is controlled using technologies described herein so that it can be substantially constant, and less than a specified amount, independent of the data pattern, and in a manner that is insensitive to manufacturing variations due to process corners.

Figure 10:
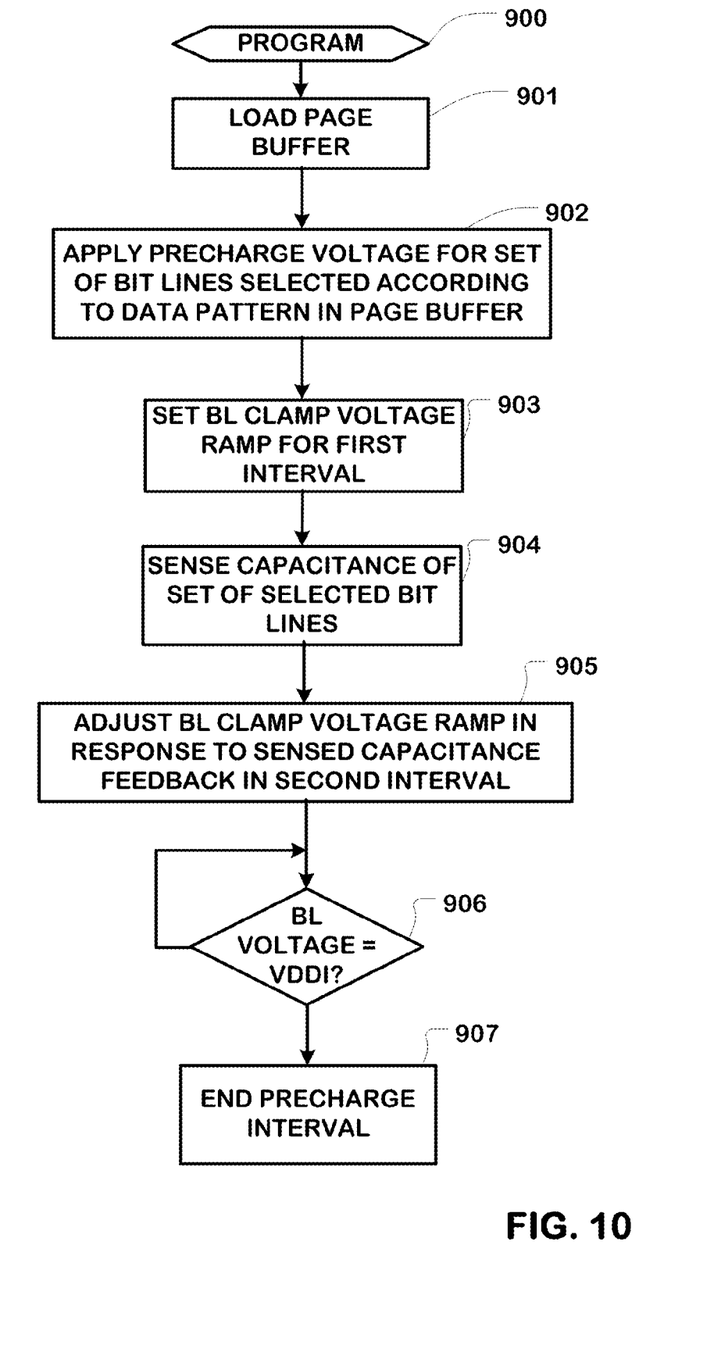
FIG. 10 is a flowchart of a method for operating a memory with controlled charging current on bit lines as described herein.

FIG. 10 is a flowchart of a method for operating a memory device which can be executed using circuitry described above, or using other circuitry suited to the particular implementation of the memory device.

In this example, a program algorithm is initiated (900). In the program algorithm, a page buffer is loaded with a data pattern (901). The algorithm includes applying a pre-charge voltage from a voltage source to the bit line clamp transistors of bit lines in a set of bit lines selected according to the data pattern in the page buffer (902). The algorithm also includes generating a bit line control signal for the bit line clamp transistors to regulate the current flow to the bit lines in response to the pre-charge voltage, and regulating the bit line control signal in response to a sensed load of the bit lines selected according to the data pattern. In this example, generating and regulating the bit line control signal includes setting a bit line control voltage ramp for a first interval of the charging cycle (903). During the first interval of the charging cycle, the load of the set of selected bit lines is sensed, such as by sensing a magnitude of the charging current (904). The algorithm includes adjusting the bit line clamp voltage ramp in response to the sensed load feedback in a second interval of the charging cycle (905). The algorithm then waits for the bit line voltage to reach the target level VDDI (906). When the bit line voltage reaches the target level, then the pre-charge interval is ended (907).

FIG. 10 is a flow chart illustrating logic executed by control circuits in a memory device. The logic can be implemented using general purpose processors, by dedicated logic hardware, including field programmable integrated circuits, and by combinations of dedicated logic hardware and computer programs. It will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A memory device, comprising:
a memory array;
a plurality of bit lines coupled to the memory array;
a voltage source configured to supply a voltage;
a plurality of bit line clamp transistors coupled to the voltage source, the bit line clamp transistors in the plurality being configured to regulate voltage on corresponding bit lines in response to a bit line control signal; and
a control circuit which controls voltage of the bit line control signal according to a ramp function with a controlled slope.

2. The device of claim 1, wherein the control circuit adjusts the controlled slope in response to a feedback signal; and
a feedback circuit, coupled to the voltage source, that senses a magnitude of the current output by the voltage source, and generates the feedback signal in response to the sensed magnitude.

3. The device of claim 1, wherein bit line clamp transistors in the plurality of bit line clamp transistors comprise respective transistors, each of the respective transistors having a first terminal in current flow communication with the voltage source, a second terminal in current flow communication with the corresponding bit line, and a gate connected to the bit line control signal, and the controlled slope maintains a gate to bit line voltage at a fixed level during a charging cycle.

4. The device of claim 1, wherein the bit line clamp transistors regulate current flow to the corresponding bit lines based on a difference between voltage on the corresponding bit lines and voltage of the bit line control signal.

5. The device of claim 2, wherein the control circuit includes a current source and an adjustable capacitor connected to current source, which produce a voltage ramp as a function of capacitance of the adjustable capacitor, and wherein the adjustable capacitor is responsive to the feedback signal to change the capacitance.

6. The device of claim 2, wherein the bit line control signal has a first slope in a first interval of a charging cycle, and has a second slope in a second interval of the charging cycle, wherein the second slope is a function of the feedback signal.

7. The device of claim 6, wherein the feedback circuit senses magnitude of current output by the voltage source during the first interval, and adjusts the feedback signal during the second interval in response to the sensed magnitude.

8. A method for operating a memory device having a page buffer and a plurality of bit lines coupled to the page buffer by bit line clamp transistors, comprising:
storing a data pattern in the page buffer;
applying a voltage from a voltage source to bit line clamp transistors of bit lines selected according to the data pattern;
generating a bit line control signal for the bit line clamp transistors having a voltage with a controlled slope to regulate current flow to the bit lines in response to said voltage.

9. The method of claim 8, including
adjusting the bit line control signal in response to a sensed load of the bit lines selected according to the data pattern.

10. The method of claim 8, wherein the bit line clamp transistors comprise respective transistors, each of the respective transistors having a first terminal in current flow communication with the voltage source, a second terminal in current flow communication with the corresponding bit line, and a gate connected to the bit line control signal, and the controlled slope maintains a gate to bit line voltage at a fixed level during a charging cycle.

11. The method of claim 9, including generating the bit line control signal according to a ramp function having a controllable slope responsive to a feedback signal based on the sensed load.

12. The method of claim 9, including generating the bit line control signal by producing a voltage ramp as a function of capacitance of an adjustable capacitor, and adjusting the adjustable capacitor in response to a feedback signal based on the sensed load.

13. The method of claim 9, wherein the bit line control signal has a first slope in a first interval of a charging cycle, and has a second slope in a second interval of the charging cycle, wherein the second slope is a function of the sensed load.

14. The method of claim 13, including sensing the sensed load by sensing magnitude of the charging current during the first interval, and setting a feedback signal during the second interval in response to the sensed magnitude, and using the feedback signal to control the controlled slope.

15. A memory device, comprising:
a memory array;
a voltage source configured to supply a voltage;
a page buffer coupled to the memory array;
a plurality of bit lines coupled to the memory array and to the page buffer;
a plurality of bit line clamp transistors coupled to respective bit lines in the plurality of bit lines and to the page buffer, and a circuit to connect the voltage source to bit line clamp transistors in the plurality of bit line clamp transistors coupled to bit lines selected in response to a data pattern stored in the page buffer;
a control circuit which generates a bit line control signal in response to a feedback signal, and applies the bit line control signal to the plurality of bit line clamp transistors; and a feedback circuit, coupled to the voltage source, that senses a load of bit lines coupled to the bit line clamp transistor selected according to the data pattern, and generates the feedback signal in response to the sensed magnitude.

16. The device of claim 15, wherein the bit line clamp transistors regulate current flow to the corresponding bit lines based on a difference between voltage on the corresponding bit lines and voltage of the bit line control signal.

17. The device of claim 15, wherein the control circuit controls voltage of the bit line clamp signal according to a ramp function having a controllable slope responsive to the feedback signal.

18. The device of claim 15, wherein the control circuit includes a current source and an adjustable capacitor connected to current source, which produces voltage ramp as a function of capacitance of the adjustable capacitor, and wherein the adjustable capacitor is responsive to the feedback signal to change the capacitance.

19. The device of claim 15, wherein the bit line control signal has a first slope in a first interval of a charging cycle, and has a second slope in a second interval of the charging cycle, wherein the second slope is a function of the feedback signal.

20. The device of claim 15, wherein the feedback circuit senses said load by sensing a magnitude of the current output by the voltage source during the first interval, and adjusts the feedback signal during the second interval in response to the sensed magnitude.

* * * * *